(12) United States Patent
Kikuchi et al.

(10) Patent No.: US 11,346,862 B2
(45) Date of Patent: May 31, 2022

(54) CURRENT SENSING DEVICE

(71) Applicant: KOA CORPORATION, Ina (JP)

(72) Inventors: Takanori Kikuchi, Nagano (JP); Miyahito Kinoshita, Nagano (JP)

(73) Assignee: KOA CORPORATION, Nagano (JP)

( * ) Notice: Subject to any disclaimer, the term of this patent is extended or adjusted under 35 U.S.C. 154(b) by 0 days.

(21) Appl. No.: 17/274,882

(22) PCT Filed: Sep. 6, 2019

(86) PCT No.: PCT/JP2019/035186
§ 371 (c)(1),
(2) Date: Mar. 10, 2021

(87) PCT Pub. No.: WO2020/054613
PCT Pub. Date: Mar. 19, 2020

(65) Prior Publication Data
US 2022/0050127 A1    Feb. 17, 2022

(30) Foreign Application Priority Data

Sep. 14, 2018    (JP) .............................. JP2018-172587

(51) Int. Cl.
| | | |
|---|---|---|
| *G01R 1/20* | (2006.01) | |
| *H05K 1/02* | (2006.01) | |
| *H05K 1/16* | (2006.01) | |
| *H05K 3/46* | (2006.01) | |

(52) U.S. Cl.
CPC ............ *G01R 1/203* (2013.01); *H05K 1/0265* (2013.01); *H05K 1/16* (2013.01); *H05K 3/4697* (2013.01); *H05K 2201/09609* (2013.01)

(58) Field of Classification Search
CPC ........ G01R 1/203; H05K 1/0265; H05K 1/16; H05K 3/4697; H05K 2201/09609
USPC .................................................. 324/549, 126
See application file for complete search history.

(56) References Cited

U.S. PATENT DOCUMENTS 8,400,139 B2 *  3/2013  Ausserlechner ......... H05K 3/28
                                                      324/117 H
2012/0068296 A1 *  3/2012  Takaya ................ H01L 29/1095
                                                      257/467

FOREIGN PATENT DOCUMENTS

| JP | 2014-239142 A | 12/2014 |
| JP | 2015-002333 A | 1/2015 |
| JP | 2015002333 A * | 1/2015 |

* cited by examiner

*Primary Examiner* — Tung X Nguyen
*Assistant Examiner* — Robert P Alejnikov, Jr.
(74) *Attorney, Agent, or Firm* — Crowell & Moring LLP

(57) ABSTRACT

Provided is a current sensing device including: a laminate having a plurality of insulating layers laminated therein; a current sensing element provided in an inner layer of the laminate; a current wire configured to flow current to the current sensing element, the current wire being provided with respect to the current sensing element via an interlayer insulating layer; a plurality of current vias configured to connect the current sensing element and the current wire so as to penetrate through the interlayer insulating layer; and a voltage sensing via configured to obtain a voltage drop in the current sensing element, the voltage sensing via being electrically connected to the current sensing element.

6 Claims, 5 Drawing Sheets

CURRENT SENSING DEVICE

RELATED APPLICATIONS

This application is a 371 application of PCT/JP2019/035186 having an international filing date of Sep. 6, 2019, which claims priority to JP2018-172587 filed Sep. 14, 2018, the entire content of each of which is incorporated herein by reference.

TECHNICAL FIELD

The present invention relates to a current sensing device.

BACKGROUND ART

Conventionally, there is proposed a current sensing device including a resistive element-incorporating substrate in which a current sensing resistive element is incorporated into a laminate of a plurality of insulating layers (ceramic layers) (see, for example, Patent Literature 1, Patent Literature 2).

In Patent Literature 1, a metal via is embedded in a via, which penetrates through the laminated insulating layers, to connect to the electrodes of a resistor in order to increase the effect of heat dissipation of the resistor incorporated into the laminated substrate.

Patent Literature 2 describes the similar structure to the one described in Patent Literature 1, in which the number of a plurality of first (second) sensing via conductors arranged in a predetermined direction is adjusted so that, without adjusting a via diameter of each of the first (second) sensing via conductors, the plurality of first (second) sensing via conductors is arranged in parallel connection, thereby artificially increasing the width W of a resistive film of a resistor to artificially adjust the width of the resistive film.

This technique can facilitate designing the resistance value of the current sensing resistance provided for the laminate, without requiring change in the diameter of each of the first and second sensing via conductors connected to the resistive film included in the current sensing resistance.

CITATION LIST

Patent Literature

Patent Literature 1: JP 2014-239142 A
Patent Literature 2: JP 2015-002333 A

SUMMARY OF INVENTION

Technical Problem

As described above, incorporating the resistor into the substrate is now a widely-used technique in an attempt to reduce the size of the current sensing device, and since a thick copper pattern as an inner layer has successfully been formed, a technique of incorporating a shunt resistor, which has a relatively large amount of current flow, into a laminated substrate has also been discussed, instead of using a substrate-mounted shunt resistor.

However, in such a conventional current sensing device with the substrate-mounted resistor, routing of current patterns and voltage sensing patterns has been studied for an appropriate use of the shunt resistor, whereas in a current sensing device with a substrate-incorporated resistor, an appropriate voltage sensing structure and the improve in current sensing accuracy related to such a structure have hardly been proposed.

It is an object of the present invention to improve the current sensing accuracy in the current sensing device using the substrate-incorporated resistor.

Solution to Problem

According to an aspect of the present invention, there is provided a current sensing device including: a laminate having a plurality of insulating layers laminated therein; a current sensing element provided in an inner layer of the laminate; a current wire configured to flow current to the current sensing element, the current wire being provided with respect to the current sensing element via an interlayer insulating layer; a plurality of current vias configured to connect the current sensing element and the current wire so as to penetrate through the interlayer insulating layer; and a voltage sensing via configured to obtain a voltage drop in the current sensing element, the voltage sensing via being electrically connected to the current sensing element.

Preferably, the current sensing device further includes a voltage wire connected to the current wire by the voltage sensing via.

Preferably, the plurality of current vias includes a proximal via that is located close to a resistive element of the current sensing element.

The voltage sensing via may be disposed so as to at least partially overlap with the proximal via.

It is preferable that the proximal via and the voltage sensing via are connected to each other with the current wire interposed therebetween.

The proximal via may have a diameter larger than a diameter of the voltage sensing via.

The present specification incorporates the disclosure of JP Patent Application No. 2018-172587 that forms the basis of the priority claim of the present application.

Effects of Invention

According to the present invention, it is possible to improve the current sensing accuracy in a current sensing device using a substrate-incorporated resistor.

DESCRIPTION OF EMBODIMENTS

Hereinafter, a current sensing device according to an embodiment of the present invention will be described in detail with reference to the drawings.

Figure 1:
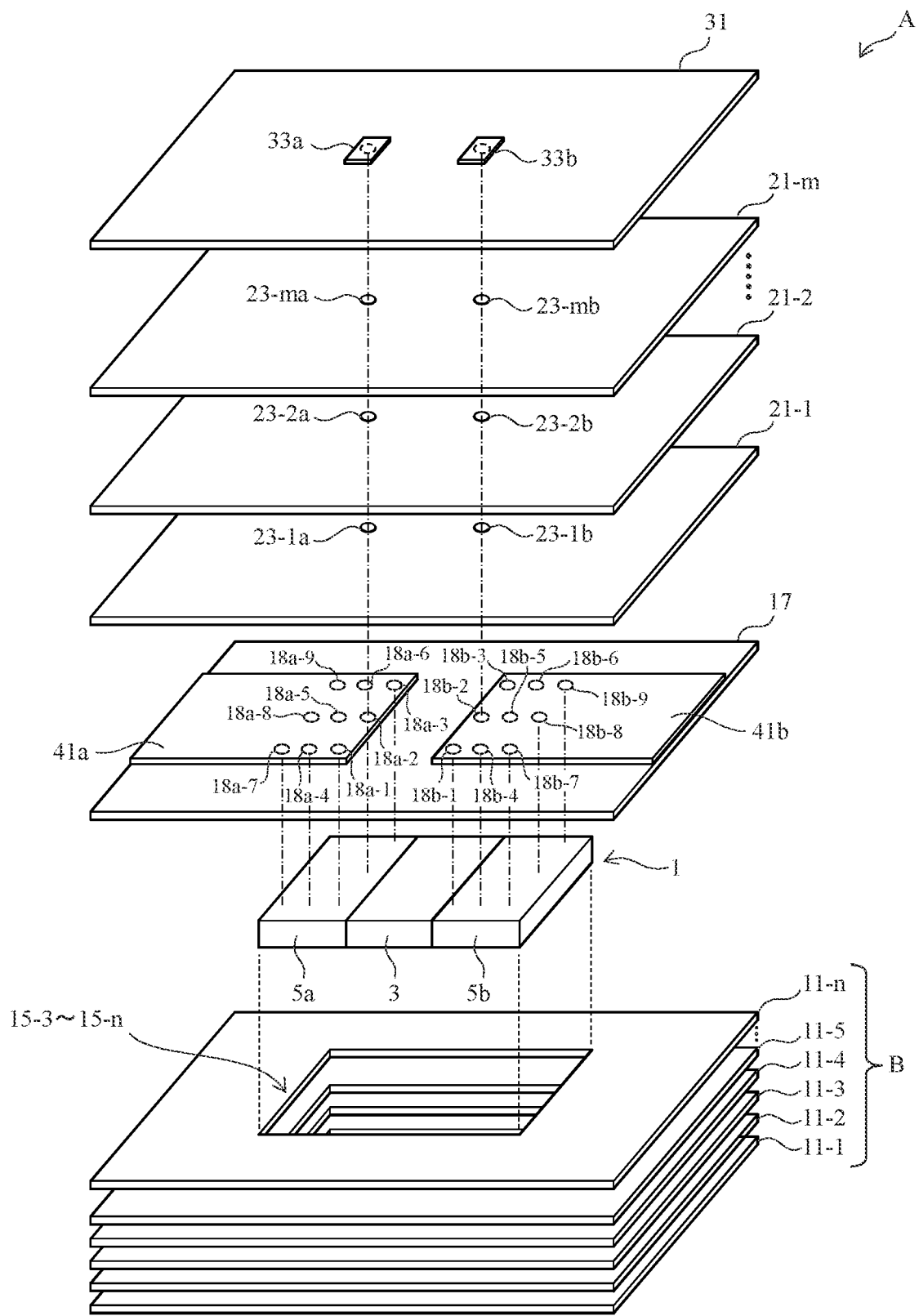
FIG. 1 is an exploded perspective view showing an exemplary configuration of a current sensing device according to an embodiment of the present invention.
Figure 2:
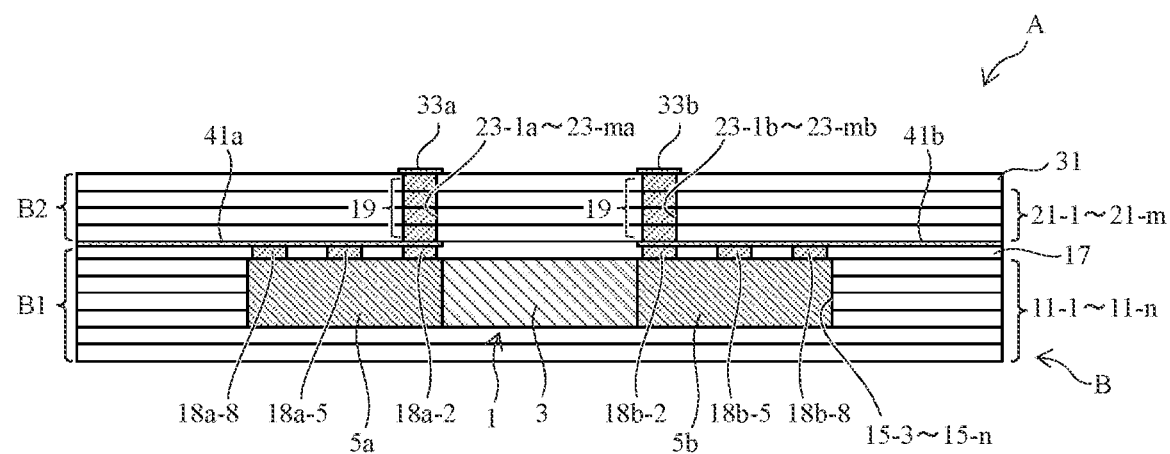
FIG. 2 is a cross-sectional view of the structure of FIG. 1.
Figure 4A:
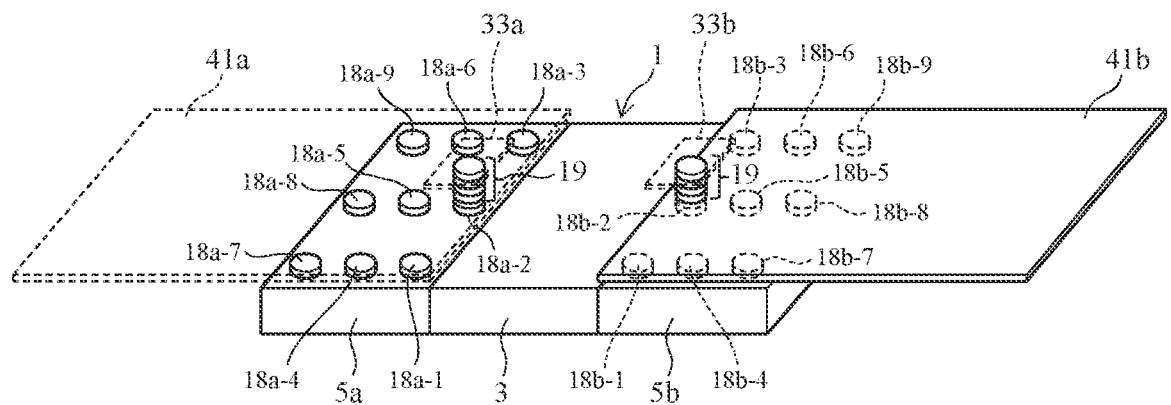
FIG. 4A is a perspective view showing an exemplary configuration of a shunt resistor and vias.
Figure 4B:
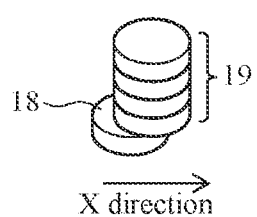
FIGS. 4BA and 4BB are views showing an exemplary positional relationship between the current via and the voltage sensing via of FIG. 4A.
Figure 4B:
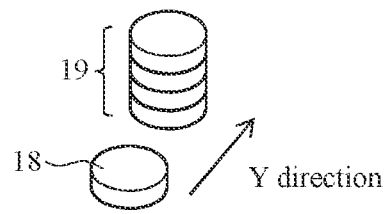

FIG. 1 is an exploded perspective view showing an exemplary configuration of a current sensing device according to an embodiment of the present invention. FIG. 2 is a cross-sectional view of the structure of FIG. 1. FIG. 4A is a perspective view showing an exemplary configuration of a sheet having current wires formed thereon. FIGS. 4BA and 4BB is a perspective view showing an exemplary detailed configuration of a passive device, for example, a shunt resistor and vias. FIGS. 4BA and 4BB is a view showing an exemplary positional relationship between the current via and the voltage sensing via of FIG. 4A.

Figure 3:
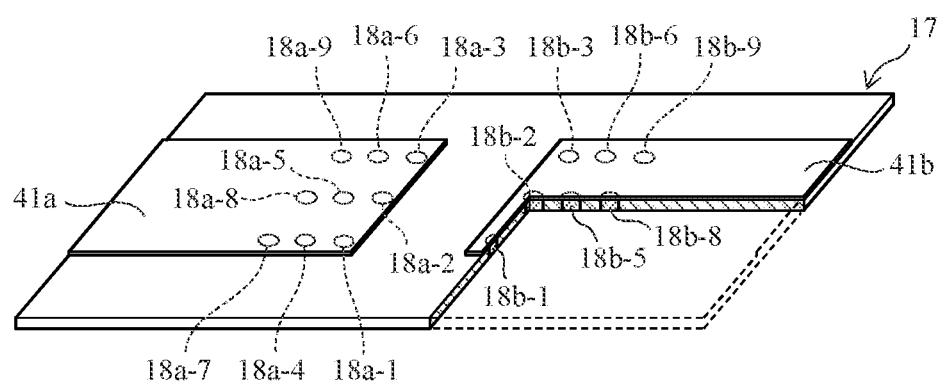
FIG. 3 is a perspective view showing an exemplary configuration of a sheet having current wires formed thereon.

As illustrated in FIG. 1, FIG. 2, and FIG. 3, a current sensing device A according to the present embodiment is constituted as a ceramic laminate, wherein a plurality of insulating layers, for example, a plurality of ceramic green sheets 11 . . . , 17, 21, 31 made from a ceramic material mainly including barium oxide, silica, alumina, etc., which is laminated in this order from the bottom and then fired. It should be noted that, other than the ceramic material, a resin multi-layer substrate formed by stacking a plurality of resin-based substrates may be used to constitute the present invention.

A base substrate B is constituted by a laminate of ceramic green sheets 11-1, 2, 3, . . . , n (where n is an integer equal to or greater than 1), for example. In the base substrate including this laminate, the ceramic green sheets 11-3, n respectively have openings 15-3, . . . , n in their respective regions that are aligned when laminated, for example.

As described above, all of the ceramic green sheets 11-1, 2, 3, . . . , n may not always have the openings. As illustrated in FIG. 1, for example, the ceramic green sheets 11-1, 2 in the bottom layers do not have an opening. In such a case, a shunt resistor 1 is disposed in an opening 15 of a second base substrate B2, which is located on a first base substrate B1 without an opening 15.

The shunt resistor 1 is embedded in the openings 15-3, . . . , n and above the ceramic green sheets 11-1, 2. The shunt resistor 1 includes, for example, a resistive element 3, and a first electrode 5a and a second electrode 5b connected to both ends of the resistive element 3.

The first electrode 5a and the second electrode 5b are made from an electrically conductive metal material such as Cu. As a material for the resistive element 3, a metal material such as a Cu Ni based, a Cu Mn based, or a Ni Cr based metal material may be used. The shunt resistor 1 may be made from a single metal including a Cu Ni based metal material or may have a film structure made from a resistive metal material. The resistive element 3 and the first and second electrodes 5a and 5b are collectively referred to as a current sensing element.

In addition, the ceramic green sheets 17, 21, 31 and the like are disposed on the ceramic green sheets 11-1 to 11-n to constitute the laminate. In this manner, the shunt resistor 1 is provided in the inner layer of the laminate.

After forming the above structure, the processes of pressing and low-temperature firing are performed so as to integrate the ceramic green sheets. Adding glass to the ceramic green sheets allows firing at a relatively low temperature of about 800° C. Thus, the process of firing for the integration may be performed after forming the shunt resistor 1 and metal wires including Ag or the like, which will be described later.

A first current wire 41a and a second current wire 41b are formed, respectively, on the regions of the ceramic green sheet 17 that overlap the first electrode 5a and the second electrode 5b of the shunt resistor 1, respectively. The first current wire 41a and the second current wire 41b are formed by screen printing, for example.

Electrically conductive vias (also referred to as metal vias, conductor vias, for example) 18a-1, 2, 3, . . . , 18a-9 (collectively denoted by 18a), which are individually embedded in a plurality of through-holes (i.e., contact holes: CH), are formed in the region on the ceramic green sheet 17 in which the first electrode 5a and the first current wire 41a are stacked in the laminating direction.

Further, electrically conductive vias 18b-1, 2, 3, . . . 18b-9 (collectively denoted by 18b), which are provided so as to be separated from each other in the in-plane direction of the ceramic green sheet 17 and individually embedded in a plurality of through-holes each having a relatively small area, are formed in the region on the ceramic green sheet 17 in which the second electrode 5b and the second current wire 41b are stacked in the laminating direction. The current vias are collectively denoted by reference numeral 18.

The electrically conductive vias may be formed by, for example, using a hole forming tool having needle-like members arrayed thereon to punch through-holes on the ceramic green sheet 17 and charging electrically conductive metal into the through-holes.

As described above, the ceramic green sheets 17, 21 each may also function as an interlayer insulating layer between the wires and the shunt resistor.

The ceramic green sheet 21 consists of laminated sheets 21-1, 21-2, . . . 21-m of the ceramic green sheets. The laminated sheets 21-1, 21-2, . . . 21-m respectively have via conductors 23-1a to 23-ma and via conductors 23-1b to 23-mb, which are provided in the positions respectively corresponding to current vias 18a-2, 18b-2 in the vertical direction. The via conductors 23-1a to 23-ma and the via conductors 23-1b to 23-mb are electrically connected to voltage wires 33a, 33b, respectively, which are provided on the ceramic green sheet 31.

The number of vias 18a, 18b may be selected. For example, the vias 18a, 18b may be arranged in the form of 3×3 or 7×3, for example. Hereinafter, the vias 18a, 18b will be referred to as "current vias." In addition, examples of the arrangement in the plane of the plurality of current vias may include arrangement with predetermined distances between the current vias in the directions parallel to and perpendicular to the longitudinal direction of the shunt resistor 1 (i.e., in the arrangement direction of electrode-resistor-electrode), for example. In the example illustrated in FIG. 1 and the following examples, the arrangement in the form of 3×3 will be described as the basic example.

As illustrated also in FIG. 2, the plurality of current vias 18 provides electrical connection between the first electrode 5a and the first current wire 41a and electrical connection between the second electrode 5b and the second current wire 41b. This configuration allows the shunt resistor 1 to sense current flowing through the first current wire 41a and the second current wire 41b. The via conductors 23-1a to 23-ma and the via conductors 23-1b to 23-mb constitute voltage sensing vias 19 separately. One of the voltage sensing vias 19 is formed by lamination into an approximately straight line with the current via 18a-2, with the first current wire 41a interposed therebetween. The other one of the voltage sensing vias 19 is formed by lamination into an approximately straight line with the current via 18b-2, with the second current wire 41b interposed therebetween.

As described above, a large number of current vias 18 formed in the ceramic green sheet 17 provide electrical connection between the electrodes of the shunt resistor 1 and the current wires 41a, 41b with the insulating ceramic green sheet 17 interposed therebetween, thus allowing a large amount of current to stably flow in the shunt resistor 1.

Therefore, it is possible to stably operate the current sensing device A and improve the reliability of the operation of the current sensing device A. Further, it is possible to improve the current sensing accuracy of the current sensing device A.

FIG. 4A is a perspective view showing an exemplary detailed configuration of the shunt resistor 1 and the current vias 18. FIG. 4A also illustrates voltage sensing vias configured to obtain a voltage drop across the first electrode 5a and the second electrode 5b. FIGS. 4BA and 4BB are views showing an exemplary positional relationship between the current via and the voltage sensing via of FIG. 4A.

FIG. 4A illustrates, in an area in the left half, a via structure in which the current wire 41a is shown by the dashed line, and in an area in the right half, a via structure in which the current wire 41b is shown by the solid line and the voltage wire 33b by the dashed line. This illustration applies also to FIG. 6 to FIG. 8. The vias 18 located below the current wire 41 are current vias. In this structure, the current vias 18 and the voltage sensing vias 19 are laminated in the laminating direction of the ceramic green sheet 17 with the current wires 41a, 41b interposed therebetween.

The voltage sensing vias 19 are laminated on respective current vias located in the closest position to the resistive element 3 of the shunt resistor 1, specifically, the proximal vias 18a-2 and 18b-2, which are respectively one of the proximal vias 18a-1 to 18a-3 and one of the proximal vias 18b-1 to 18b-3, for example.

Then, the voltage wires 33a, 33b are formed on the voltage sensing vias 19. This configuration allows the voltage sensing vias 19 to be disposed in the closest position to the resistive element 3 in each of the first electrode 5a and the second electrode 5b. Accordingly, the distance between each voltage sensing via 19 and the resistive element 3 can be reduced, and the influence of the Temperature Coefficient Resistance (TCR) by the electrodes 5a, 5b made from Cu, for example, of the shunt resistor 1 can be reduced. FIGS. 4BA and 4BB illustrate a positional relationship between the voltage sensing via 19 and the current via 18 located below the voltage sensing via 19. FIG. 4BA shows an example in which the voltage sensing via 19 and the current via 18 are displaced from each other in the X direction. However, since the voltage sensing via 19 and the current via 18 share an overlapping portion, the current sensing accuracy can be maintained. Meanwhile, FIG. 4BB shows an example in which the voltage sensing via 19 and the current via 18 are displaced from each other in the Y direction and do not share an overlapping portion. Though omitted in the drawing, the voltage sensing via 19 and the current via 18 are conductively connected via the wire 41. It is preferable that the current sensing via 19 is connected to the portion in the electrode 5 as close as possible to the resistive element 3. However, in the structure of the example of FIG. 4BB, current passes through the wire 41 made from Cu constituting the current path by the amount of displacement from the current via 18, and thus the voltage sensing via is substantially connected in the position separated from the resistive element 3. This structure may be affected by the TCR of the wire 41, for example, and thus is not preferable in sensing current with high accuracy.

Figure 5:
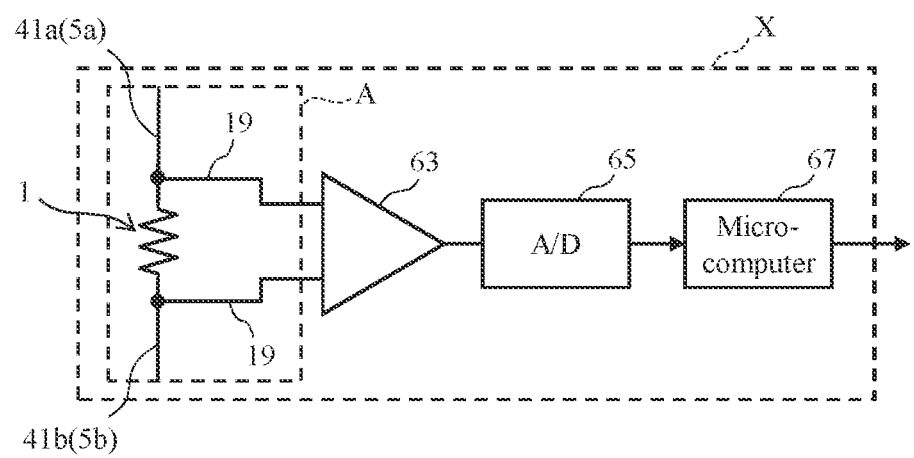
FIG. 5 is a functional block diagram showing an exemplary circuit configuration of the current sensing device.

FIG. 5 is a functional block diagram showing an exemplary circuit configuration of the current sensing device, and illustrates an example of the state where the shunt resistor 1 is mounted. The shunt resistor 1 is disposed between the wires 41a, 41b formed on the ceramic green sheet 17. The voltage wires 19, 19 for measuring voltage are connected to the electrodes 5a, 5b of the shunt resistor 1, respectively. The other ends of the voltage wires 19, 19 are connected to an IC. It should be noted that, though omitted in FIG. 1, FIG. 2, etc., the IC may be installed on or incorporated into the current sensing device A including the laminate, or may be a separate component from the current sensing device A. The IC may be connected to the current sensing device A by wires. These components constitute a current sensing module X as a whole. The IC incorporates an A/D converter circuit 65, an amplifier circuit 63, and a micro-computer 67, for example, and outputs a signal according to a voltage signal to various devices. This structure can constitute the current sensing module X capable of measuring current that flows through the wires 41a, 41b by the shunt resistor 1.

As described above, according to the present embodiment, it is possible to improve the current sensing accuracy in the current sensing device using the substrate-incorporated shunt resistor. It is also possible to improve the reliability of the current sensing device. Further, it is possible to reduce the influence of the TCR.

Hereinafter, modifications of the current sensing device of the present embodiment will be described.

First Modification

Figure 6:
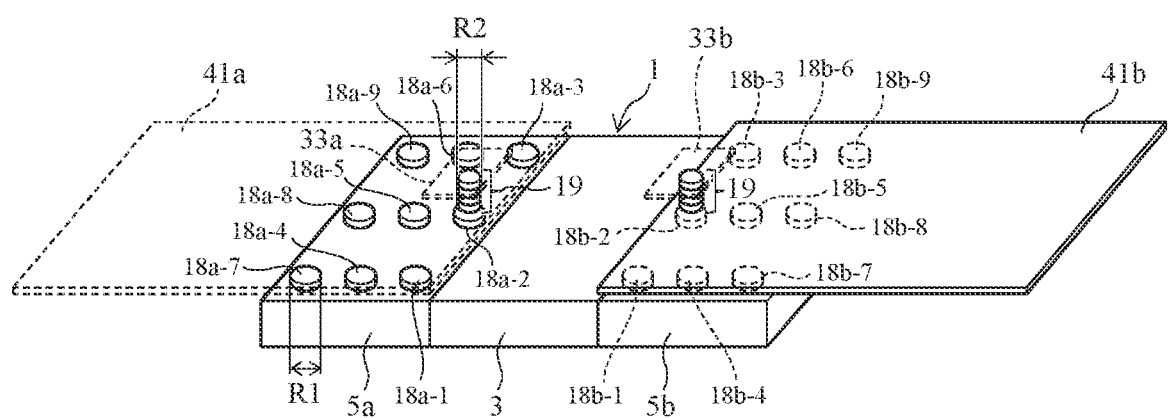
FIG. 6 is a perspective view of the structure of FIG. 4A according to a first modification.

FIG. 6 is a perspective view explaining the structure of the shunt resistor and the vias in the current sensing device according to a first modification of the present embodiment, which corresponds to FIG. 4A. As illustrated in FIG. 6, according to the first modification, the diameter R2 of the voltage sensing via 19 is smaller than the diameter R1 (this reference numeral is given to 18-7 in the drawing) of the current via 18a-2. The same applies to the current via 18b-2.

This configuration allows the voltage sensing via 19 to be easily disposed within the plane of the current via 18, and even when the relative position between the voltage sensing via 19 and the current via 18 as laminated is slightly displaced in the in-plane direction of the ceramic green sheet (17), it is possible to reduce the influence on the current sensing accuracy caused by the displacement.

Second Modification

Figure 7:
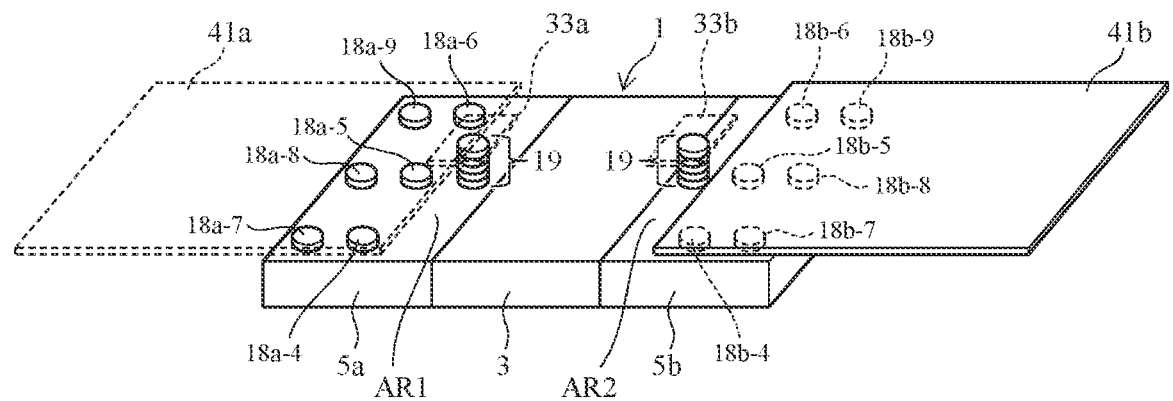
FIG. 7 is a perspective view of the structure of FIG. 4A according to a second modification.

FIG. 7 is a perspective view explaining the structure of the shunt resistor and the vias in the current sensing device according to a second modification of the present embodiment, which corresponds to FIG. 4A.

As illustrated in FIG. 7, according to the second modification, the voltage sensing via 19 is directly connected to the electrodes 5a, 5b of the shunt resistor 1, without having the current wires 41a, 41b interposed therebetween. That is, the current via 18 is not provided in areas AR1, AR2 that are close to the resistive element 3. The plurality of current vias 18 is provided.

This configuration has the advantage of not requiring the process of alignment of the current via 18 and the voltage sensing via 19.

However, since a connection area needs to be specifically secured for the voltage sensing via 19, the current wires 41a, 41*b* each have a smaller effective connection area as compared to that in the other examples of the present embodiment.

Third Modification

Figure 8:
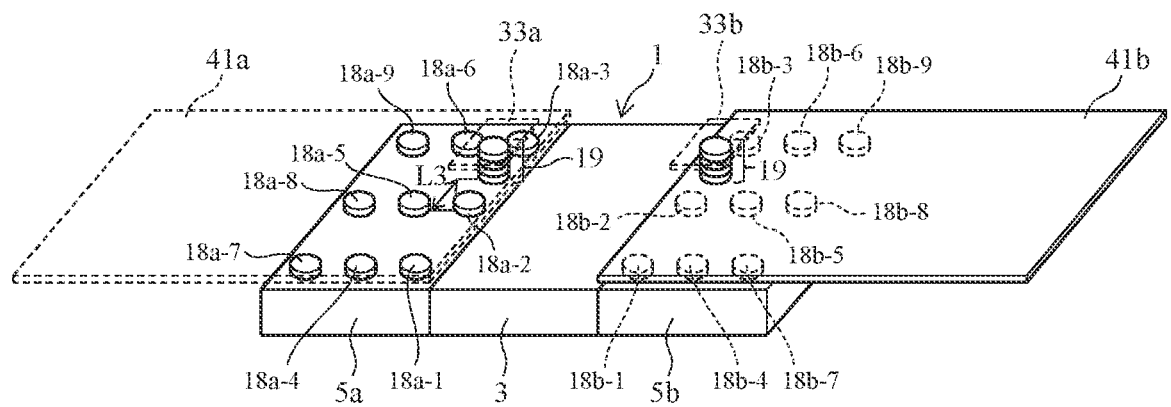
FIG. 8 is a perspective view of the structure of FIG. 4A according to a third modification.

FIG. 8 is a perspective view explaining the structure of the shunt resistor and the vias in the current sensing device according to a third modification of the present embodiment, which corresponds to FIG. 4A.

As illustrated in FIG. 8, according to the third modification, the plurality of current vias 18 is formed, and the effective connection area of the current wires 41*a*, 41*b* is secured. The voltage sensing via 19 is disposed between the current via 18*a*-2 and the current via 18*a*-3 so as to be separated by a distance L3 in a direction in which the connection surfaces between the resistive element 3 and the electrodes 5*a*, 5*b* extend. The voltage sensing via 19 on the side of the electrode 5*b* is disposed in the same manner.

In the above configuration, since the plurality of current vias 18 is formed, a stable current path can be secured. In addition, since the voltage sensing via 19 does not overlap with the current via 18*a*-2 or the current via 18*a*-3, the above configuration has the advantage of not requiring alignment of the current via 18 and the voltage sensing via 19. However, the current sensing accuracy in the third modification is lower as compared to that in the other examples of the present embodiment.

In the foregoing embodiments, the configurations and the like depicted in the attached drawings are not limiting, and may be modified, as appropriate, within the scope in which the effects of the present invention can be obtained. Other various modifications may be made and implemented, as appropriate, without departing from the scope of the purpose of the present invention. The individual constituent elements of the present invention may be added or omitted as needed, and an invention provided with the added or omitted configuration is also included in the present invention.

INDUSTRIAL APPLICABILITY

The present invention may be utilized in a current sensing device.

All publications, patents, and patent applications cited in this specification are incorporated herein by reference in their entirety.

The invention claimed is:

1. A current sensing device comprising:
tiers of insulating layers laminated one over another, wherein at least one tier of insulating layers has an opening formed therein so that the opening formed in the at least one tier of insulating layers forms a chamber inside the tiers;
a current sensing element placed inside the chamber formed in the at least one tier of insulating layers, wherein the current sensing element is formed in a planar shape extensive in a length direction and a width direction perpendicular to the length direction and comprises two electrodes and a resistive element sandwiched between the two electrodes in the length direction; and
a pair of planar current wires placed apart from each other within the tiers of insulating layers so that there is at least one insulating layer present between the pair of planar current wires and the current sensing element, wherein the air of planar current wires are arranged on the at least one insulating layer so as to overlap over the electrodes of the current sensing element with the at least one insulating layer therebetween, the pair of planar current wires being connected to an outside power source;
two groups of electrically conductive vias formed through the at least one insulating layer, wherein the two groups of electrically conductive vias each collectively function as an electrical conductor between one of the planar current wires and the current sensing element so that electrical current from the outside power source flows through one of the pair of planar current wires, then through one of the electrodes of the current sensing element, then through the resistive element to generate a shunt voltage, then through another of the electrodes and then through the other of the pair of planar current wires, and wherein each group of electrically conductive vias are arranged in a matrix having more than one electrically conductive via; and
a pair of columnar voltage sensing vias extending through at least one of the tiers of insulating layers so as to expose tops of the pair of columnar voltage sensing vias from the top of the tiers of insulating layers, the pair of columnar voltage sensing vias having bottoms electrically connected, respectively, to the electrodes of the current sensing element so that the shunt voltage is detectable across the tops of the pair of voltage sensing vias.

2. The current sensing device according to claim 1, further comprising a pair of voltage sensing electrodes connected, respectively, to the tops of the pair of columnar voltage sensing vias at the top of the tiers of insulting layers.

3. The current sensing device according to claim 1, wherein each group of electrically conductive vias includes a proximal via located closer to the resistive element of the current sensing element than any other electrically conductive vias in the group.

4. The current sensing device according to claim 3, wherein the pair of columnar voltage sensing vias is disposed so as to at least partially overlap, respectively, with the proximal vias.

5. The current sensing device according to claim 3, wherein the proximal vias and the pair of columnar voltage sensing vias are connected to each other with the planar current wires interposed therebetween.

6. The current sensing device according to claim 3, wherein each proximal via has a diameter larger than a diameter of the columnar voltage sensing via.

* * * * *

UNITED STATES PATENT AND TRADEMARK OFFICE
CERTIFICATE OF CORRECTION

PATENT NO. : 11,346,862 B2
APPLICATION NO. : 17/274882
DATED : May 31, 2022
INVENTOR(S) : Takanori Kikuchi et al.

Page 1 of 1

It is certified that error appears in the above-identified patent and that said Letters Patent is hereby corrected as shown below:

In the Claims

In Column 8, Claim 1, Line 8, delete "air" and replace with --pair--.

In Column 8, Claim 2, Line 40, delete "insulting" and replace with --insulating--.

Signed and Sealed this
Twenty-seventh Day of December, 2022

Katherine Kelly Vidal
*Director of the United States Patent and Trademark Office*